United States Patent
Lee et al.

(10) Patent No.: US 12,347,481 B2
(45) Date of Patent: Jul. 1, 2025

(54) UNIVERSAL MEMORY FOR IN-MEMORY COMPUTING AND OPERATION METHOD THEREOF

(71) Applicant: MACRONIX INTERNATIONAL CO., LTD., Hsinchu (TW)

(72) Inventors: Feng-Min Lee, Hsinchu (TW); Po-Hao Tseng, Taichung (TW); Yu-Yu Lin, New Taipei (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 217 days.

(21) Appl. No.: 18/297,055

(22) Filed: Apr. 7, 2023

(65) Prior Publication Data
US 2024/0242757 A1    Jul. 18, 2024

Related U.S. Application Data
(60) Provisional application No. 63/439,157, filed on Jan. 16, 2023.

(51) Int. Cl.
*G11C 11/405*    (2006.01)
*G11C 11/4096*    (2006.01)
(Continued)

(52) U.S. Cl.
CPC ........ *G11C 11/4096* (2013.01); *G11C 11/405* (2013.01); *G11C 11/54* (2013.01); *G11C 16/26* (2013.01)

(58) Field of Classification Search
CPC ... G11C 11/405; G11C 11/4096; G11C 11/54; G11C 16/26
(Continued)

(56) References Cited

U.S. PATENT DOCUMENTS
5,889,303 A    3/1999    Eckert
6,314,017 B1    11/2001    Emori et al.
(Continued)

FOREIGN PATENT DOCUMENTS
TW    462127 B    11/2001
TW    202040756 A    11/2020
(Continued)

OTHER PUBLICATIONS
Non-Final Office Action issued in U.S. Appl. No. 18/147,015, filed Dec. 28, 2022, mailed Aug. 13, 2024.

*Primary Examiner* — Ly D Pham
(74) *Attorney, Agent, or Firm* — McClure, Qualey & Rodack, LLP

(57) ABSTRACT

A universal memory for In-Memory Computing and an operation method thereof are provided. The universal memory includes at least one write word line, at least one unit cell and at least one read word line. The unit cell includes a write transistor and a read transistor. The gate of the write transistor is connected to the write word line. The write transistor is a transistor with adjustable threshold voltage. The gate of the read transistor is connected to the drain or the source of the write transistor. The read word line is connected to the drain or the source of the read transistor. The universal memory is used for a training mode and an inference mode. In the training mode and the inference mode, a weight is stored at different locations of the unit cell.

10 Claims, 17 Drawing Sheets

(51) Int. Cl.
 *G11C 11/54* (2006.01)
 *G11C 16/26* (2006.01)

(58) Field of Classification Search
 USPC .................................................. 365/189.15
 See application file for complete search history.

(56) References Cited

U.S. PATENT DOCUMENTS

| | | | |
|---|---|---|---|
| 7,915,666 | B2 | 3/2011 | Yasui |
| 8,331,150 | B2 | 12/2012 | Hsu |
| 9,001,564 | B2* | 4/2015 | Takemura ............ H10D 64/667 |
| | | | 257/407 |
| 10,297,322 | B2 | 5/2019 | Yamazaki et al. |
| 11,664,070 | B2 | 5/2023 | Lin et al. |
| 11,748,062 | B2 | 9/2023 | Tseng et al. |
| 2002/0012272 | A1 | 1/2002 | Shukuri |
| 2004/0109344 | A1 | 6/2004 | Yamauchi |
| 2005/0073871 | A1* | 4/2005 | Luk ........................ H10B 12/00 |
| | | | 257/E27.084 |
| 2005/0280000 | A1* | 12/2005 | Ishii ................... H10D 84/0144 |
| | | | 257/E21.624 |
| 2006/0227648 | A1* | 10/2006 | Kameshiro ............ H10B 12/00 |
| | | | 365/230.05 |
| 2007/0164347 | A1 | 7/2007 | Kim |
| 2008/0258205 | A1 | 10/2008 | Ishimaru |
| 2009/0237997 | A1 | 9/2009 | Rao |
| 2012/0182064 | A1 | 7/2012 | Hiramoto |
| 2013/0064015 | A1 | 3/2013 | Tailliet |
| 2013/0141157 | A1* | 6/2013 | Takemura .............. G11C 19/28 |
| | | | 257/296 |
| 2016/0104713 | A1 | 4/2016 | Hsieh |
| 2020/0066326 | A1* | 2/2020 | Rios ...................... G11C 11/409 |
| 2022/0108742 | A1 | 4/2022 | Li et al. |
| 2022/0352180 | A1 | 11/2022 | Lin et al. |
| 2024/0062817 | A1 | 2/2024 | Kao |
| 2024/0221822 | A1* | 7/2024 | Tseng ................. G11C 11/4091 |
| 2024/0412778 | A1* | 12/2024 | Zhu ..................... G11C 11/4085 |

FOREIGN PATENT DOCUMENTS

| | | |
|---|---|---|
| TW | 202230164 A | 8/2022 |
| TW | 202230367 A | 8/2022 |
| TW | 202245070 A | 11/2022 |

\* cited by examiner

UNIVERSAL MEMORY FOR IN-MEMORY COMPUTING AND OPERATION METHOD THEREOF

This application claims the benefit of U.S. provisional application Ser. No. 63/439,157, filed Jan. 16, 2023, the subject matter of which is incorporated herein by reference.

TECHNICAL FIELD

The disclosure relates in general to a memory and an operation method thereof, and more particularly to a universal memory for in-memory computing and an operation method thereof.

BACKGROUND

In the calculation of the artificial intelligence model, a large amount of data needs to be moved between the memory and the processor, forming a Von-Neumann bottleneck. In order to improve the efficiency of the operation, an In-Memory Computing architecture is proposed.

The operation of the artificial intelligence model includes a training mode and an inference mode. In the training mode, it is necessary to repeatedly program and erase the memory to change the weight, and a memory with higher endurance is required. In the inference mode, it is necessary to keep the weight for inference calculations, and a memory with higher retention is required.

However, memory with high reliability and memory with high retention are usually different types of memory. In the traditional memory technology, it is difficult to find a memory with high reliability and high retention at the same time, so there is no memory that can be applied to the training mode and the inference mode of the artificial intelligence computing at the same time.

SUMMARY

The disclosure is directed to a universal memory for in-memory computing and an operation method thereof. 2T structure is used, so that the universal memory can be applied to the training mode and the inference mode of artificial intelligence. In the training mode and the inference mode, the weight is stored in different locations of the unit cell. When the universal memory is executed in the training mode, it can provide high reliability like Dynamic Random Access Memory (DRAM), so as to satisfy a large number of updating actions on the weight; when the universal memory is executed in the inference mode, it can provide the same as the non-volatility and high retention of non-volatile memory enable the weight to be kept well with low power consumption.

According to one embodiment, a universal memory for In-Memory Computing (IMC) is provided. The universal memory includes at least one write word line, at least one unit cell and at least one read word line. The unit cell includes a write transistor and a read transistor. A gate of the write transistor is connected to the write word line, and the write transistor is a transistor with adjustable threshold voltage. A gate of the read transistor is connected to a drain or a source of the write transistor. The read word line is connected to a drain or a source of the read transistor. In a training mode, a storage potential of a storage node between the write transistor and the read transistor represents a weight of the unit cell. In an inference mode, a threshold voltage of the write transistor represents the weight of the unit cell.

According to another embodiment, an operation method of a universal memory for In-Memory Computing (IMC) is provided. The universal memory includes at least one unit cell. The unit cell includes a write transistor and a read transistor. A gate of the read transistor is connected to a drain or a source of the write transistor. The operation method includes the following steps. A weight changing procedure of a training mode is performed. In the weight changing procedure of the training mode, a storage node between the write transistor and the read transistor is charged or discharged to change a storage potential of the storage node, and the storage potential of the storage node represents a weight of the unit cell. A weight setting procedure of an inference mode is performed. In the weight setting procedure of the inference mode, a hot carrier injection is performed on the write transistor to change a threshold voltage of the write transistor, and the threshold voltage of the write transistor represents the weight of the unit cell.

According to an alternative embodiment, a universal memory for In-Memory Computing (IMC) is provided. The universal memory includes at least one write word line, at least one unit cell and at least one read word line. The unit cell includes a write transistor and a read transistor. A gate of the write transistor is connected to the write word line, and the write transistor is a transistor with adjustable threshold voltage. A gate of the read transistor is connected to a drain or a source of the write transistor. The read word line is connected to a drain or a source of the read transistor. The universal memory is used for a training mode and an inference mode. In the training mode and the inference mode, a weight is stored at different locations of the unit cell.

Figure 1:
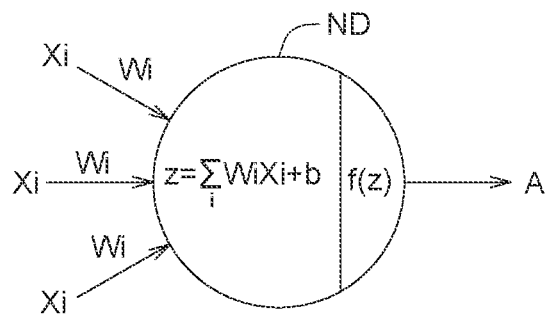
FIG. 1 shows a schematic diagram of a node of an artificial intelligence model according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows a schematic diagram of a node ND of an artificial intelligence model according to an embodiment. After the node ND receives a plurality of input signals Xi, these input signals Xi and a plurality of weights Wi are multiply-accumulated (MAC) and a bias b is added to obtain a computed value z. Then, the computed value z is calculated through an activation function f to obtain an output value a. The output value a will be input to the node at the next layer.

Figure 2:
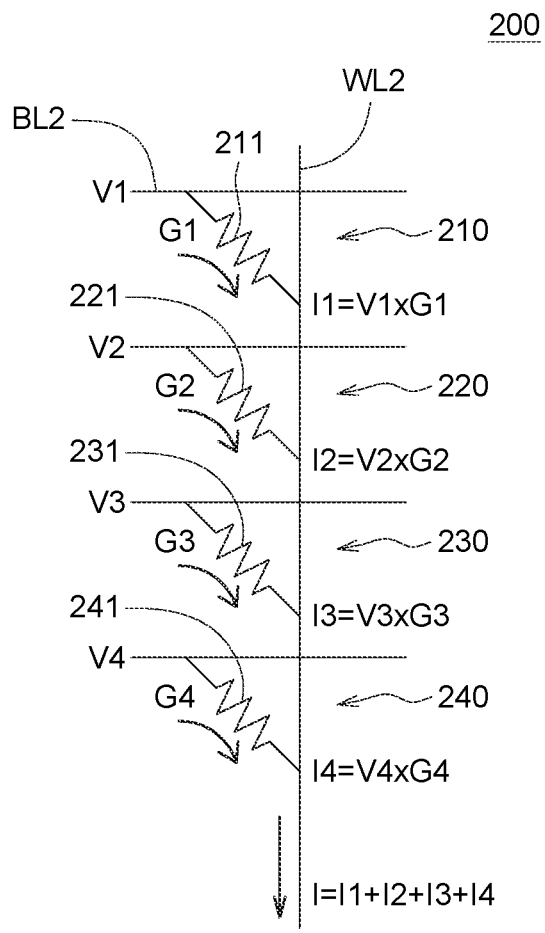
FIG. 2 shows a memory for performing multiply-accumulation.

As shown in FIG. 1, the multiply-accumulation is a very important action in the artificial intelligence operation. Please refer to FIG. 2, which shows a memory 200 for performing multiply-accumulation. The memory 200 includes, for example, a plurality of unit cells 210, 220, 230, 240. The unit cells 210, 220, 230, 240 include, for example, resistors 211, 221, 231, 241 respectively. The resistors 211, 221, 231, 241 have conductances G1, G2, G3, G4 respectively. When voltages V1, V2, V3, V4 are respectively inputted to a bit line BL2, a word line WL2 will form a plurality of read currents I1, I2, I3, I4 respectively. The read current I1 is equivalent to a product of the voltage V1 and the conductance G1; the read current I2 is equivalent to a product of the voltage V2 and the conductance G2; the read current I3 is equivalent to a product of the voltage V3 and the conductance G3; the read current I4 is equivalent to a product of the voltage V4 and the conductance G4. A total current I is equivalent to a sum of products of the voltages V1, V2, V3, V4 and the conductances G1, G2, G3, G4. If the voltages V1, V2, V3, V4 represent the input signals Xi, and the conductances G1, G2, G3, G4 represent the weights Wi, then the total current I represents the sum of the products of the input signals Xi and the weights Wi as described in the following equation (1). Through the memory 200 in FIG. 2, the multiply-accumulation in the artificial intelligence operation can be realized.

$$I = \sum_i (w_i * x_i) = \sum_i (G_i * V_i) \qquad (1)$$

Figure 3:
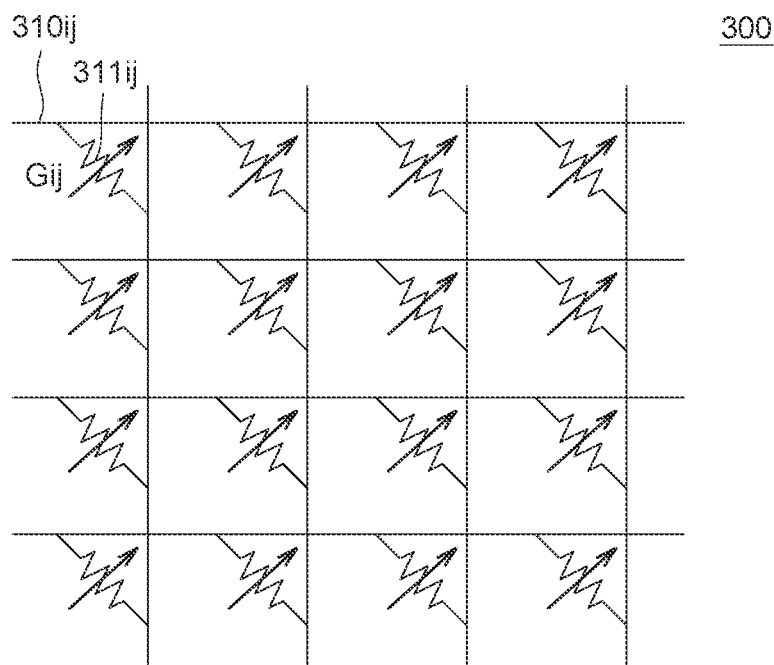
FIG. 3 illustrates a memory for executing a training mode according to an embodiment.

Please refer to FIG. 3, which illustrates a memory 300 for executing the training mode according to an embodiment. The memory 300 includes, for example, a plurality of unit cells 310ij arranged in a matrix. Each of the unit cells 310ij has an adjustable resistor 311ij, for example. Each of the adjustable resistors 311ij has a conductance Gij. These conductances Gij represent the weights Wij. When executing the training mode, the weights Wij need to be updated continuously, so the memory 300 with the adjustable resistors 311ij can be used to execute the training mode smoothly.

Figure 4:
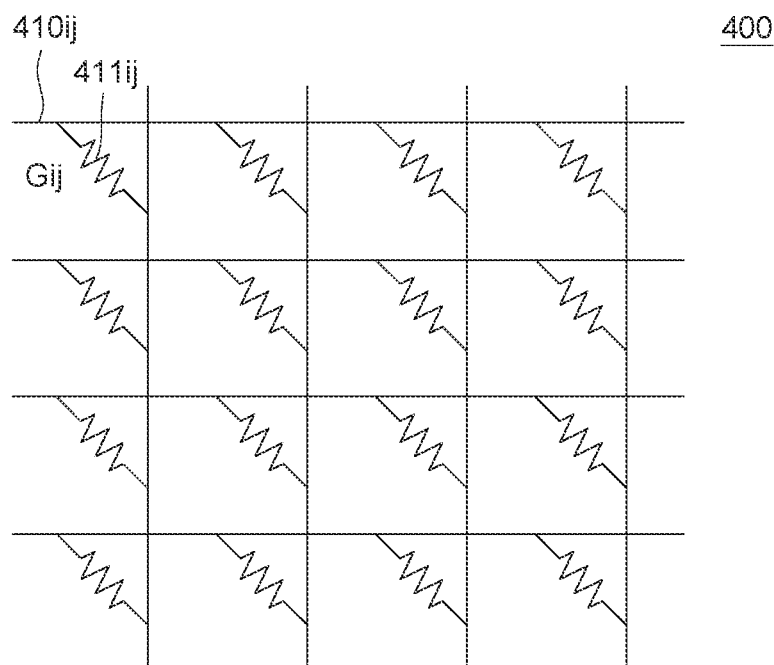
FIG. 4 illustrates a memory for executing an inference mode according to an embodiment.

Please refer to FIG. 4, which illustrates a memory 400 for executing the inference mode according to an embodiment. The memory 400 includes, for example, a plurality of unit cells 410ij arranged in a matrix. Each of the unit cells 410ij has a fixed resistor 411ij, for example. Each of the fixed resistors 411ij has a conductance Gij. These conductances Gij represent the weights Wij. In the process of executing the inference mode, the weights Wij have already been set and should not be changed arbitrarily, so the memory 400 with the fixed resistors 411ij can be used to execute the inference mode smoothly.

The requirements of the training mode and the inference mode are different. For example, the memory that executes the training mode needs to have high endurance to meet a large number of updating actions on the weights Wi; the memory that executes the inference mode needs to have non-volatility and high retention, so that the weights Wi can be kept at low power consumption. Generally speaking, these two types of memory are completely different. For example, the memory 300 in FIG. 3 and the memory 400 in FIG. 4 use completely different resistors (the adjustable resistors 311ij and the fixed resistors 411ij).

Figure 5:
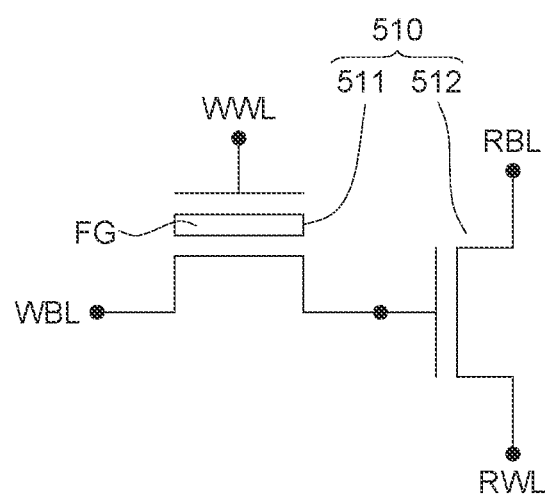
FIG. 5 shows a unit cell used for In-Memory Computing (IMC) according to an embodiment.

Please refer to FIG. 5, which shows a unit cell 510 used for In-Memory Computing (IMC) according to an embodiment. The In-Memory Computing is also called as Computing In-Memory, Processing In-Memory (PIM), or In-Memory Processing. The unit cell 510 includes a write transistor 511 and a read transistor 512. Since the unit cell 510 is composed of two transistors, it is also called 2T structure. The write transistor 511 is a transistor with adjustable threshold voltage. A gate of the write transistor 511 includes a charge storage layer FG. The gate of the read transistor 512 is connected to a drain or a source of the write transistor 511.

The write transistor 511 needs to have a low off-current to ensure good data retention. The material of the channel layer of the write transistor 511 is, for example, indium gallium zinc oxide (IGZO), indium oxide (In2O3), silicon (Si), germanium (Ge), or trivalent group-pentavalent group material. The read transistor 512 needs to have a high on-current to ensure reading accuracy. The material of the channel layer of the read transistor 512 is, for example, Indium Gallium Zinc Oxide (IGZO), Indium Oxide (In2O3), Silicon (Si), Germanium (Ge) or Trivalent-pentavalent materials.

Figure 6:
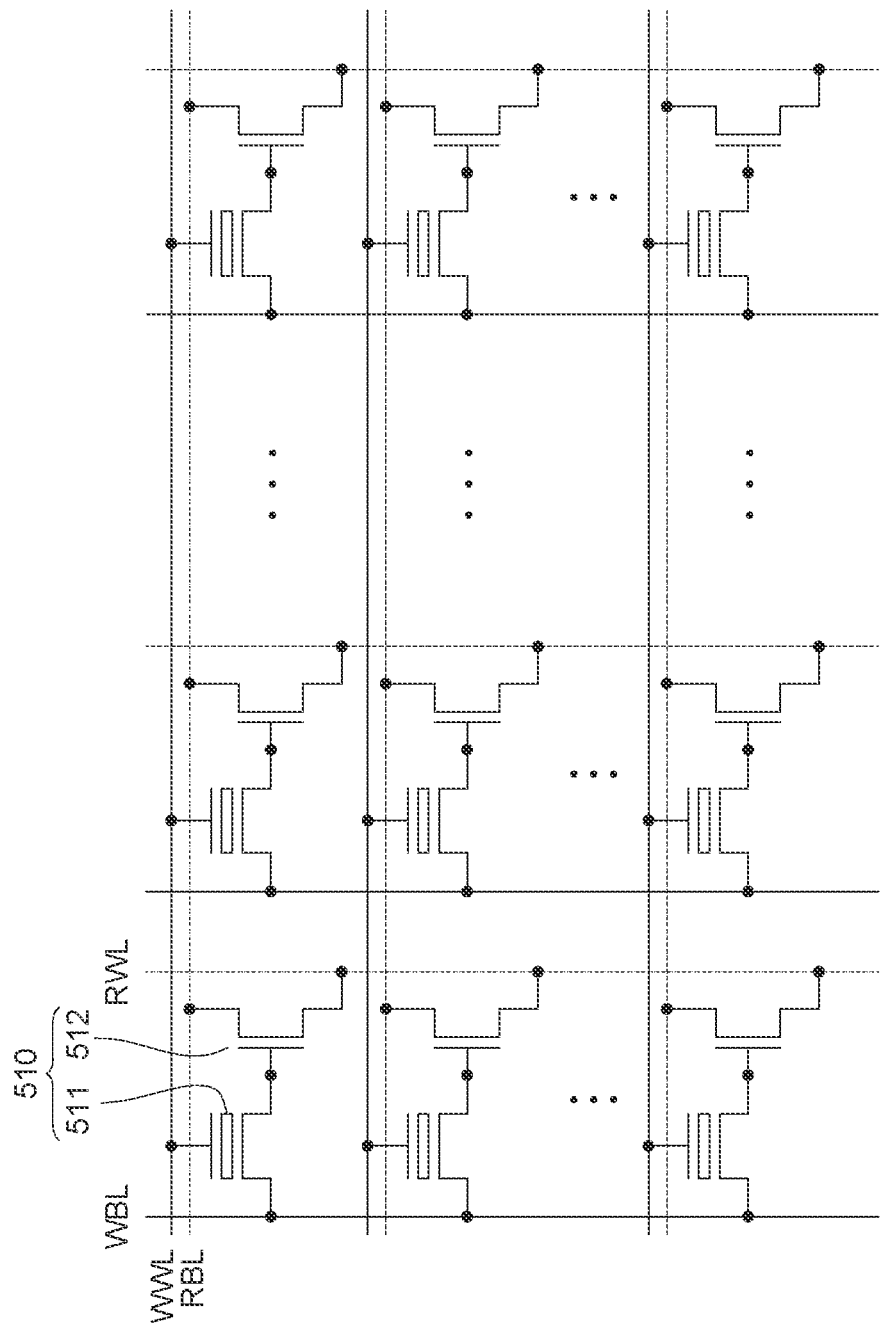
FIG. 6 illustrates a universal memory according to an embodiment.

Please refer to FIG. 6, which illustrates a universal memory 500 according to an embodiment. The universal memory 500 includes a plurality of unit cells 510 arranged in a matrix. The universal memory 500 includes one or more write word lines WWL, one or more read word lines RWL, one or more write bit lines WBL, one or more read bit lines RBL and a plurality of unit cells 510. The gate of the write transistor 511 is connected to the write word line WWL, one of the drain and the source of the write transistor 511 is connected to the write bit line WBL, and the another of the drain and the source of the write transistor 511 is connected to the gate of the read transistor 512. The gate of the read transistor 512 is connected to the drain or the source of the write transistor 511, one of the drain and the source of the read transistor 512 is connected to the read bit line RBL, and another of the drain and the source of the read transistor 512 is connected to the read word line RWL.

In this embodiment, the universal memory 500 is applicable to both of the training mode and the inference mode of the artificial intelligence. That is to say, when the universal memory 500 is executed in the training mode, it can provide high reliability like Dynamic Random Access Memory (DRAM), so as to satisfy a large number of updating actions on the weight Wi; when the universal memory 500 is executed in the inference mode, it can provide the same as the non-volatility and high retention of non-volatile memory enable the weight Wi to be kept well with low power consumption. The following describes the operation of the training mode and the inference mode of the universal memory 500 respectively.

Figure 7:
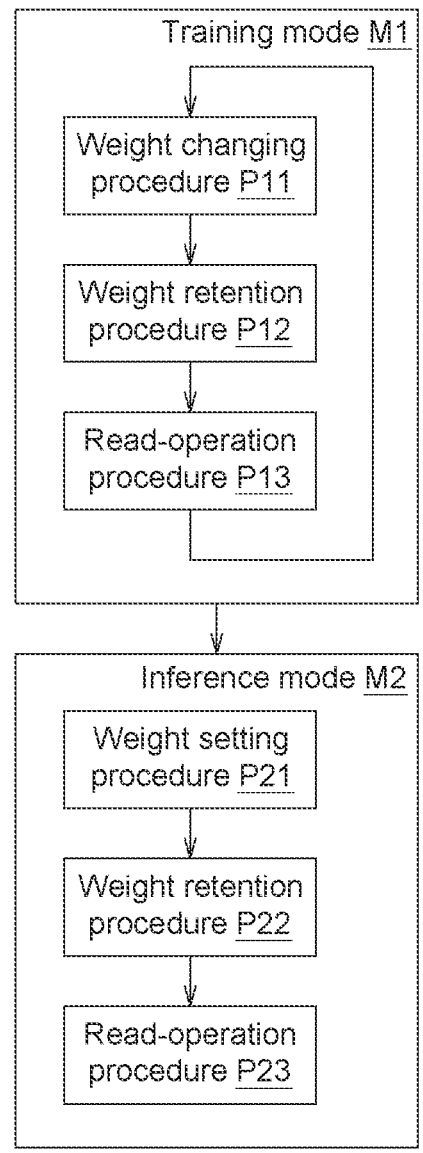
FIG. 7 shows a flowchart of the operation method of the universal memory.

Please refer to FIG. 7, which shows a flowchart of the operation method of the universal memory 500. The universal memory 500 is suitable for the training mode M1 and the inference mode M2 of the artificial intelligence. The training mode M1 includes a weight changing procedure P11, a weight retention procedure P12 and a read-operation procedure P13. The weight changing procedure P11 is used to change the weight Wi; the weight retention procedure P12 is used to temporarily keep the weight Wi; the read-operation procedure P13 is used to read the weight Wi and perform the product operation at the same time. In the training mode M1, the weight changing procedure P11, the weight retention procedure P12 and the read-operation procedure P13 will be executed repeatedly to optimize the artificial intelligence model by continuously adjusting the weight Wi.

The inference mode M2 includes a weight setting procedure P21, a weight retention procedure P22 and a read-operation procedure P23. The weight setting procedure P21 is used to set the weight Wi; the weight retention procedure P22 is used to keep the weight Wi; the read-operation procedure P23 is used to read the weight Wi and perform the product operation at the same time. In the inference mode M2, the weight Wi will not change frequently.

Figure 8:
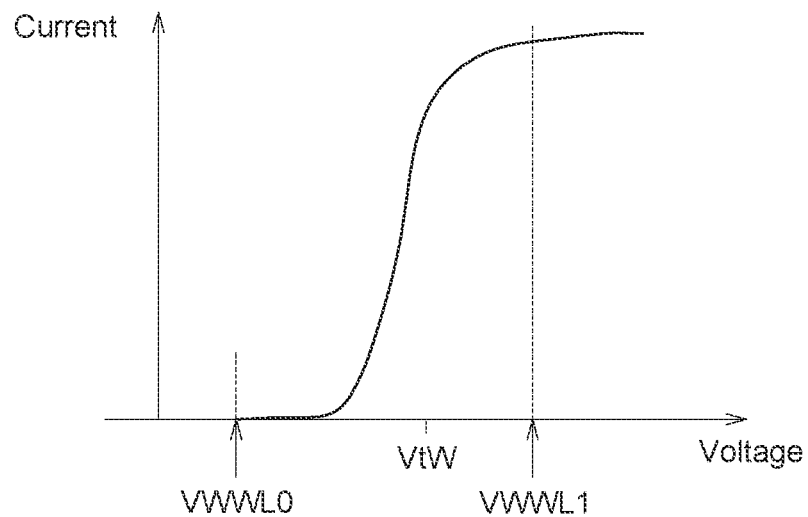
FIG. 8 shows a characteristic curve diagram of a write transistor in the training mode according to an embodiment.

The operation of the training mode M1 will be firstly described below. Please refer to FIG. 8, which shows a characteristic curve diagram of the write transistor 511 in the training mode M1 according to an embodiment. In the training mode M1, the charge storage layer FG of the write transistor 511 will not be changed, so the characteristic curve will not be changed. When a higher voltage VWWL1 is applied to the gate of the write transistor 511, the write transistor 511 can be turned on; when a lower voltage VWWL0 is applied to the gate of the write transistor 511, the write transistor 511 can be turned off.

Figure 9:
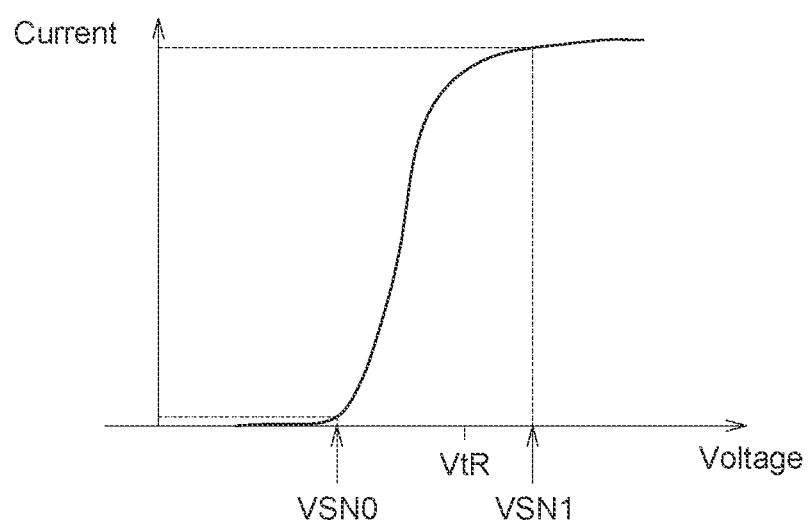
FIG. 9 shows a characteristic curve diagram of a read transistor in the training mode according to an embodiment.

Please refer to FIG. 9, which shows a characteristic curve diagram of the read transistor 512 in the training mode M1 according to an embodiment. In the training mode M1, when the gate of the read transistor 512 has a higher storage potential VSN1, the read transistor 512 can be turned on; when the gate of the read transistor 512 has a lower storage potential VSN0, the read transistor 512 can be turned off.

Figure 10A:
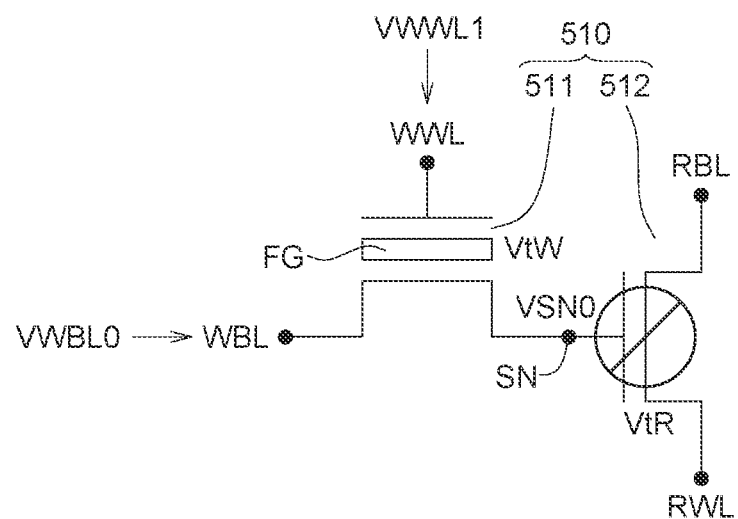
FIG. 10A illustrates that a weight of "0" is written to the unit cell during a weight changing procedure of the training mode.

Please refer to FIG. 10A, which illustrates that the weight Wi of "0" is written to the unit cell 510 during the weight changing procedure P11 of the training mode M1. In the training mode M1, the weight Wi is stored in the storage node SN between the write transistor 511 and the read transistor 512.

When the unit cell 510 is going to be written the weight Wi of "0" during the weight changing procedure P11 of the training mode M1, the write word line WWL is applied with a higher voltage VWWL1 (for example, 3V) to turn on the write transistor 511; the write bit line WBL is applied with a lower bias voltage VWBL0 (for example, 0V).

Since the write transistor 511 is turned on, the voltage VWBL0 input by the write bit line WBL can be input to the storage node SN, so that the storage node SN has a storage potential VSN0 (for example, 0V) lower than the threshold voltage VtR of the read transistor 512. The storage potential VSN0 of the storage node SN can represent the weight Wi of "0" of unit cell 510.

Figure 10B:
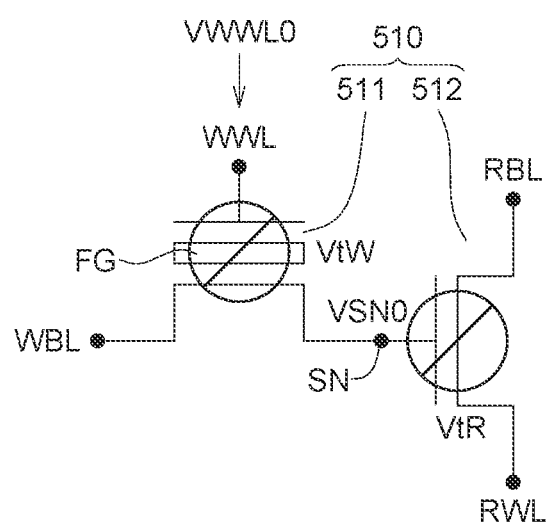
FIG. 10B illustrates the unit cell during a weight retention procedure of the training mode.

Please refer to FIG. 10B, which illustrates the unit cell 510 during the weight retention procedure P12 of the training mode M1. When the unit cell 510 intends to temporarily keep the weight Wi during the training mode M1, a lower voltage VWWL0 (for example, 0V) is applied to the write word line WWL to turn off the write transistor 511.

Since the write transistor 511 has been turned off, the storage potential VSN0 of the storage node SN will not change.

Figure 10C:
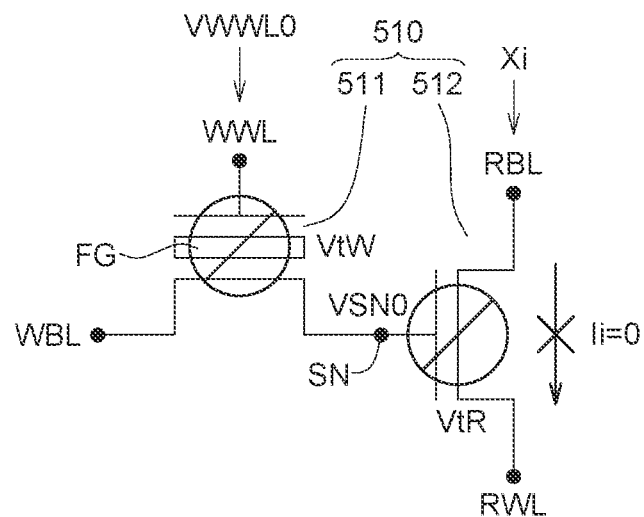
FIG. 10C illustrates the unit cell during a read-operation procedure of the training mode.

Please refer to FIG. 10C, which illustrates the unit cell 510 during the read-operation procedure P13 of the training mode M1. When the weight Wi of the unit cell 510 is going to be read and then multiplied, the write word line WWL is applied with a lower voltage VWWL0 (for example, 0V) to turn off the write transistor 511; the read bit line RBL is applied with the input signal Xi (for example, 0.8V).

Since the storage potential VSN0 is lower than the threshold voltage VtR of the read transistor 512, the read transistor 512 is turned off, and no read current Ii will be generated on the read bit line RBL. The amount of the read current Ii (for example, 0) is equivalent to the product of the input signal Xi and the weight Wi of "0".

Figure 11A:
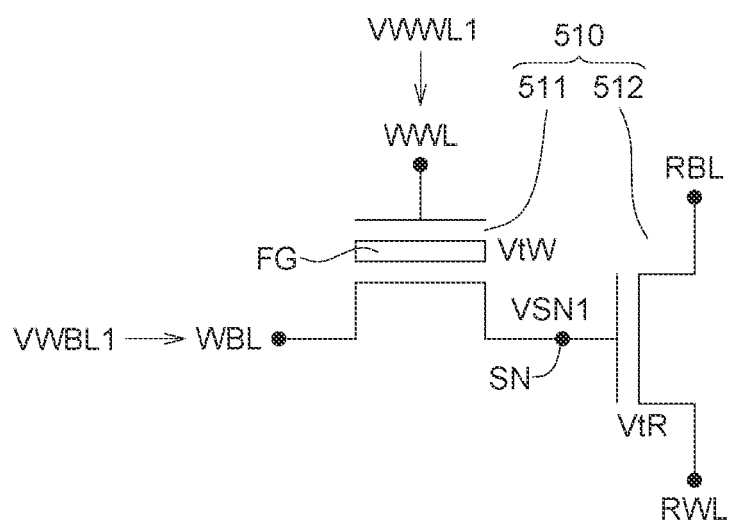
FIG. 11A illustrates that a weight of "1" is written in the unit cell during a weight changing procedure of the training mode.

Please refer to FIG. 11A, which illustrates that the weight Wi of "1" is written in the unit cell 510 during the weight changing procedure P11 of the training mode M1. In the training mode M1, the weight Wi is stored in the storage node SN between the write transistor 511 and the read transistor 512.

When the unit cell 510 is going to be written the weight Wi of "1" during the weight changing procedure P11 of the training mode M1, a higher voltage VWWL1 (for example, 3V) is applied to the write word line WWL to turn on the write transistor 511; the write bit line WBL is applied with a higher voltage VWBL1 (for example, 1V).

Since the write transistor 511 has been turned on, the voltage VWBL1 input by the write bit line WBL can be input to the storage node SN, so that the storage node SN has a storage potential VSN1 (for example, 1V) higher than the threshold voltage VR of the read transistor 512. The storage potential VSN1 of the storage node SN can represent the weight Wi of "1" of the unit cell 510. As mentioned above, in the weight changing procedure P11 of the training mode M1, when the weight Wi is changed, the threshold voltage VtW of the write transistor 511 is unchanged.

Figure 11B:
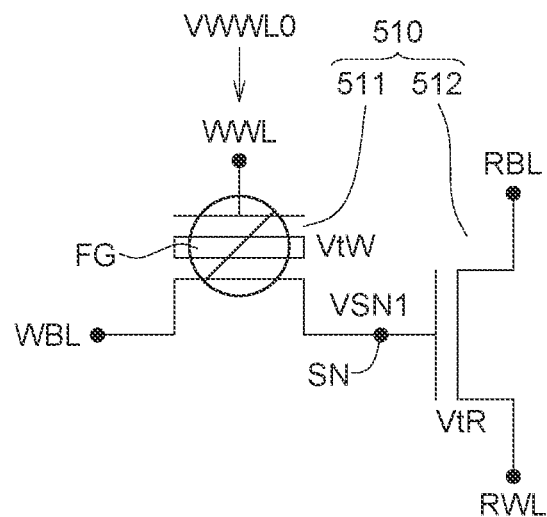
FIG. 11B illustrates the unit cell during the weight retention procedure of the training mode.

Please refer to FIG. 11B, which illustrates the unit cell 510 during the weight retention procedure P12 of the training mode M1. When the unit cell 510 intends to temporarily keep the weight Wi during the training mode M1, the lower voltage VWWL0 (for example, 0V) is applied to the write word line WWL to turn off the write transistor 511.

Since the write transistor 511 has been turned off, the storage potential VSN1 of the storage node SN will not be lost.

Figure 11C:
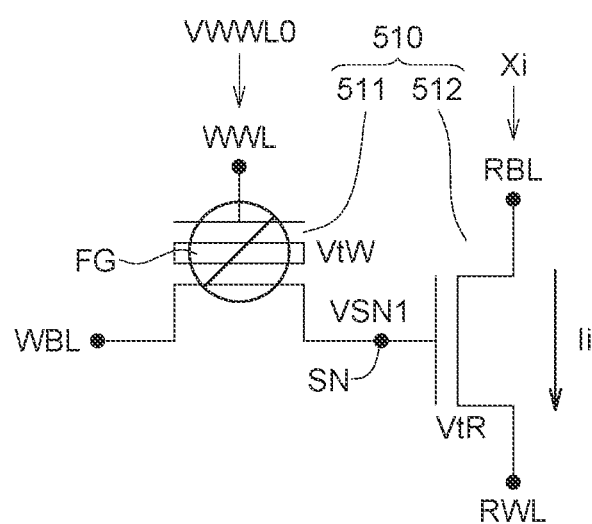
FIG. 11C illustrates the unit cell during the read-operation procedure of the training mode.

Please refer to FIG. 11C, which illustrates the unit cell 510 during the read-operation procedure P13 of the training mode M1. During the read-operation procedure P13 of the training mode M1, the weight Wi is unchanged. When the weight Wi of the unit cell 510 is to going to be read and then multiplied, the write word line WWL is applied with the lower voltage VWWL0 (for example, 0V) to turn off the write transistor 511; the read bit line RBL is applied with the input signal Xi (for example is 0.8V).

Since the storage potential VSN1 is higher than the threshold voltage VtR of the read transistor 512, the read transistor 512 will be turned on, and the read current Ii will be generated on the read bit line RBL. The amount of the read current Ii is equivalent to the product of the input signal Xi and the weight Wi of "1".

The above-mentioned operation in FIGS. 10A to 11C can be organized in the following Table I, but the Table I is only an example of values, and is not intended to limit the present invention.

TABLE I

| | Training mode M1 | | | |
|---|---|---|---|---|
| | Weight changing procedure P11 | | Weight | |
| | Write the weight Wi of "0" | Write the weight Wi of "1" | retention procedure P12 | Read-operation procedure P13 |
| voltage of the write word line WWL | 3 V | 3 V | 0 V | 0 V |
| voltage of the write bit line WBL | 0 V | 1 V | don't care | 0 V |
| voltage of the read word line RWL | 0 V | 0 V | 0 V | 0 V |
| voltage of the read bit line RBL | 0 V | 0 V | 0 V | 0.8 V |

Figure 12:
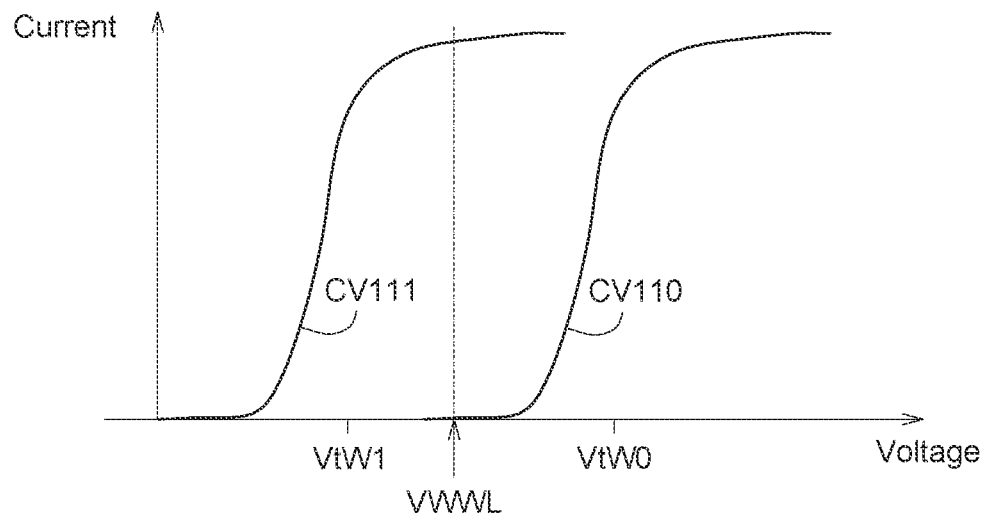
FIG. 12 shows a characteristic curve diagram of the write transistor in the inference mode according to an embodiment.

The description of the inference mode M2 will be continued below. Please refer to FIG. 12, which shows a characteristic curve diagram of the write transistor 511 in the inference mode M2 according to an embodiment. In the inference mode M2, the charge storage layer FG of the write transistor 511 can be set to have two different amounts of charges, so the write transistor 511 has two characteristic curves CV110, CV111. When a predetermined voltage VWWL is applied to the gate of the write transistor 511, if the write transistor 511 has a higher threshold voltage VtW0 (as shown by the characteristic curve CV110), the write transistor 511 will be turned off; if the write transistor 511 has a lower threshold voltage VtW1 (as shown by the characteristic curve CV111), then the write transistor 511 will be turned on.

Figure 13:
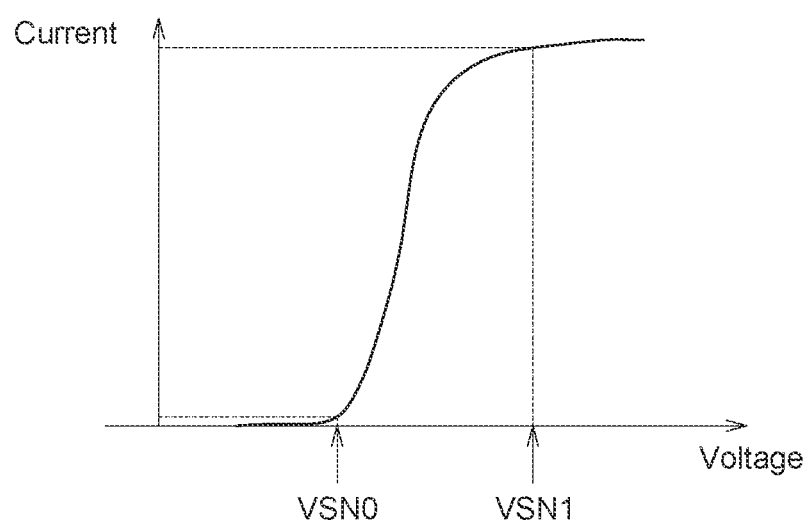
FIG. 13 shows a characteristic curve diagram of the read transistor in the inference mode according to an embodiment.

Please refer to FIG. 13, which shows a characteristic curve diagram of the read transistor 512 in the inference mode M2 according to an embodiment. In the inference mode M2, when the gate of the read transistor 512 has a higher storage potential VSN1, the read transistor 512 can be turned on; when the gate of the read transistor 512 has a lower storage potential VSN0, the read transistor 512 can be turned off.

Figure 14A:
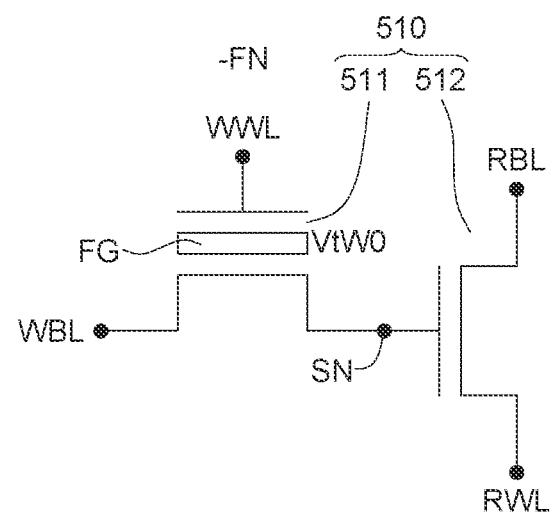
FIG. 14A illustrates that the weight of "0" is written to the unit cell during a weight setting procedure of the inference mode.

Please refer to FIG. 14A, which illustrates that the weight Wi of "0" is written to the unit cell 510 during the weight setting procedure P21 of the inference mode M2. The write transistor 511 is a transistor with adjustable threshold voltage. The gate of the write transistor 511 includes a charge storage layer FG. In the inference mode M2, the threshold voltage VtW0 of the write transistor 511 represents the weight Wi of "0". Usually, the Fowler-Nordheim tunneling and hot carrier injection mechanism (+FN/−FN) can be used to modify the amount of the charges. The amount of charges in the storage layer makes the write transistor 511 have the higher threshold voltage VtW0 or the lower threshold voltage VtW1 (shown in FIGS. 15A to 15C).

When the unit cell 510 is going to be written the weight Wi of "0" during the weight setting procedure P21 of the inference mode M2, the −FN mechanism is executed through the write word line WWL, so that the write transistor 511 has the higher threshold voltage VtW0.

Figure 14B:
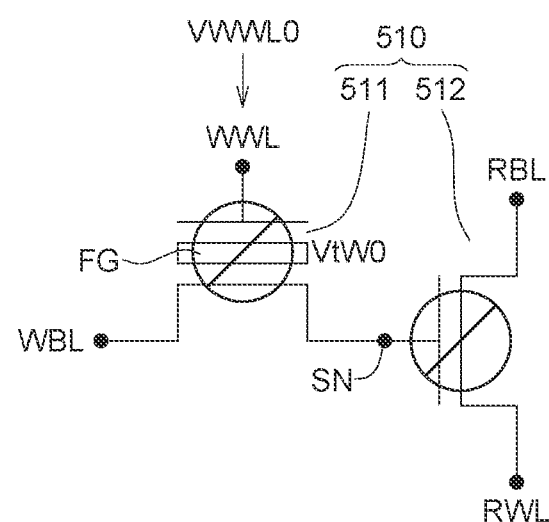
FIG. 14B illustrates the unit cell during the weight retention procedure of the inference mode.

Please refer to FIG. 14B, which illustrates the unit cell 510 during the weight retention procedure P22 of the inference mode M2. When the unit cell 510 intends to keep the weight Wi during the inference mode M2, the write word line WWL is applied with a lower voltage VWWL0 (for example, 0V) to turn off the write transistor 511.

Figure 14C:
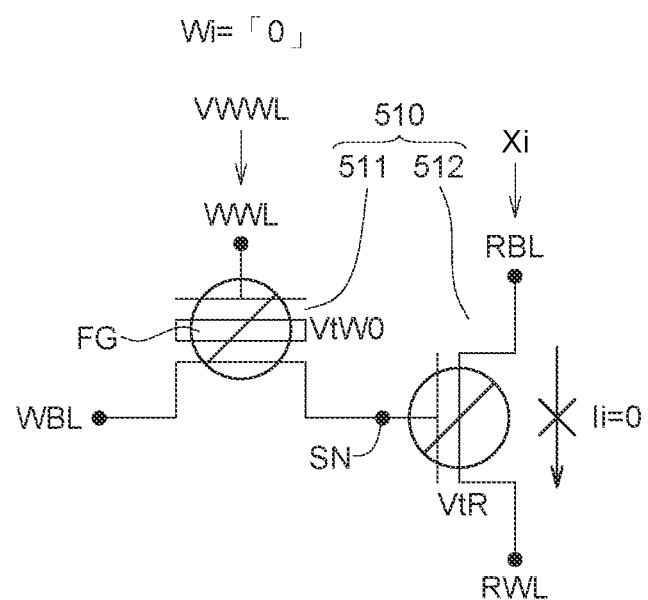
FIG. 14C illustrates the unit cell during the read-operation procedure of the inference mode.

Please refer to FIG. 14C, which illustrates the unit cell 510 during the read-operation procedure P23 of the inference mode M2. When the weight Wi of the unit cell 510 is going to be read and multiplied, the write word line WWL is applied with the predetermined voltage VWWL (between threshold voltage VtW1 and threshold voltage VtW0); the write bit line WBL is applied with the higher voltage VWBL1 (higher than the threshold voltage VtR of the read transistor 512). The voltage VWWL is lower than the threshold voltage VtW0, and the write transistor 511 cannot be turned on. Therefore, the voltage VWBL1 cannot be inputted to the read transistor 512, so the read transistor 512 will be turned off, and the read current Ii will not be generated on the read bit line RBL. The amount of the read current Ii (for example, 0) is equivalent to the product of the input signal Xi and the weight Wi of "0".

Figure 15A:
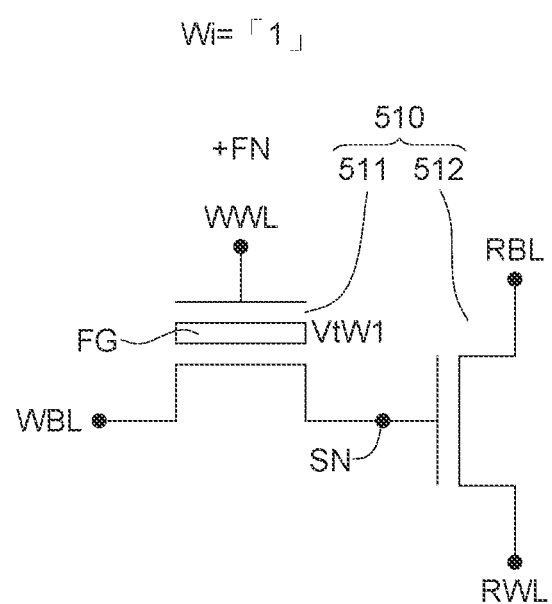
FIG. 15A illustrates that the weight of "1" is written in the unit cell during the weight setting procedure of the inference mode.

Please refer to FIG. 15A, which illustrates that the weight Wi of "1" is written in the unit cell 510 during the weight setting procedure P21 of the inference mode M2. When the unit cell 510 is going to be written the weight Wi of "1" during the weight setting procedure P21 of the inference mode M2, the +FN mechanism is executed through the write word line WWL, so that the write transistor 511 has the lower threshold voltage VtW1.

Figure 15B:
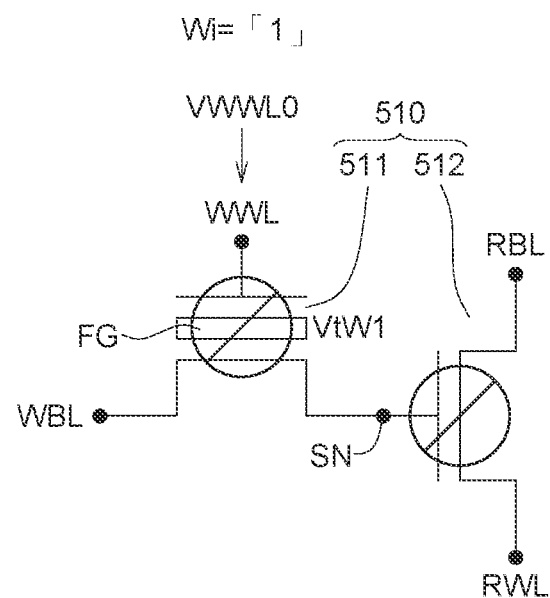
FIG. 15B illustrates the unit cell during the weight retention procedure of the inference mode.

Please refer to FIG. 15B, which illustrates the unit cell 510 during the weight retention procedure P22 of the inference mode M2. When the unit cell 510 intends to keep the weight Wi during the inference mode M2, the write word line WWL is applied with the lower voltage VWWL0 (for example, 0V) to turn off the write transistor 511.

Figure 15C:
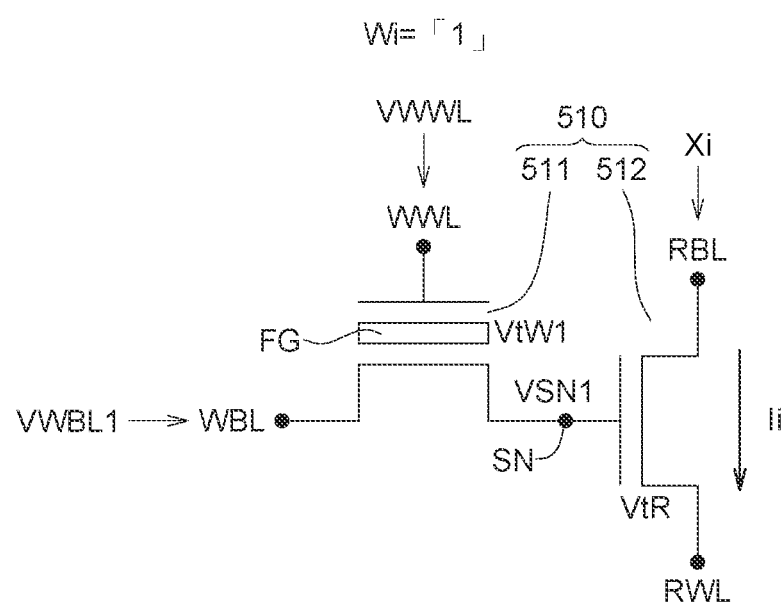
FIG. 15C illustrates the unit cell during the read-operation procedure of the inference mode.

Please refer to FIG. 15C, which illustrates the unit cell 510 during the read-operation procedure P23 of the inference mode M2. In the read-operation procedure P23 of the inference mode M2, the weight Wi is unchanged. When the weight Wi of the unit cell 510 is going to be read and multiplied, the write word line WWL is applied with the predetermined voltage VWWL (between the threshold voltage VtW1 and the threshold voltage VtW0); the write bit line WBL is applied with the higher voltage VWBL1 (higher than the threshold voltage VtR of the read transistor 512). The voltage VWWL is higher than the threshold voltage VtW1, so that the write transistor 511 is turned on. Therefore, the voltage VWBL1 can be inputted to the read transistor 512, so the read transistor 512 will be turned on, and the read current Ii will be generated on the read bit line RBL. The amount of the read current Ii is equivalent to the product of the input signal Xi and the weight Wi of "1".

The above-mentioned operations in FIGS. 14A to 15C can be organized in the following Table II, but the Table II is only an example of values, and is not intended to limit the present invention.

TABLE II

| | Inference mode M2 | | | |
|---|---|---|---|---|
| | Weight setting procedure P21 | | Weight | |
| | Write the weight Wi of "0" | Write the weight Wi of "1" | retention procedure P22 | Read-operation procedure P23 |
| voltage of the write word line WWL | −FN | +FN | 0 V | VWWL (between the threshold voltage VtW1 and the threshold voltage VtW0) |
| voltage of the write bit line WBL | 0 V | 0 V | don't care | VWBL1 (higher than the threshold voltage VtR) |
| voltage of the read word line RWL | 0 V | 0 V | 0 V | 0 V |
| voltage of the read bit line RBL | 0 V | 0 V | 0 V | VDD |

Figure 16:
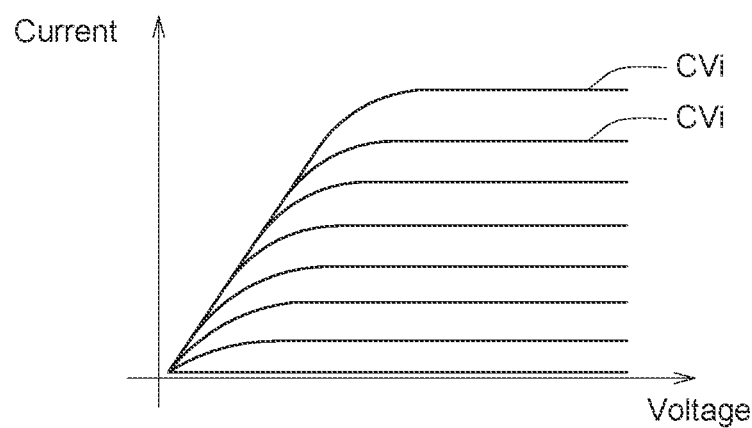
FIG. 16 shows the relationship between the current and the voltage on a read bit line.
Figure 17:
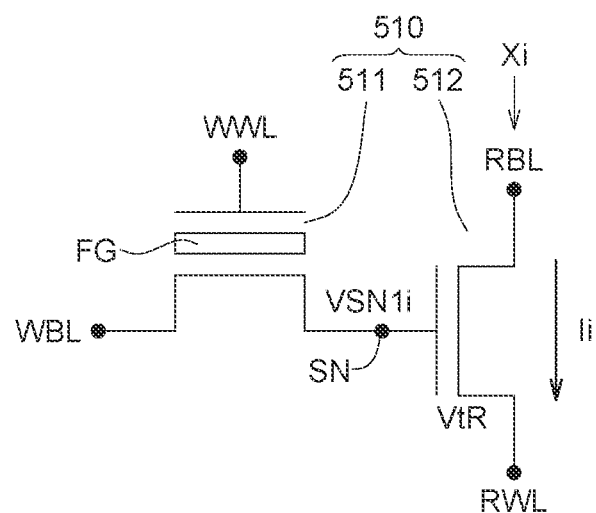
FIG. 17 illustrates a storage potential.

The above-mentioned weight Wi is illustrated by taking the two-bit value of "0" and "1" as an example. In another embodiment, the weight Wi may also be an analog value with decimals. Please refer to FIGS. 16 to 17. FIG. 16 shows the relationship between the current and the voltage on the read bit line RBL, and FIG. 17 illustrates the storage potential VSN1i. As shown in the FIG. 16, the curves CVi correspond to different gate-overdrive voltages. As shown in FIG. 17, the gate-overdrive voltage is the difference between the storage potential VSN1i and the threshold voltage VtR of the read transistor 512. Corresponding to different storage potentials VSN1i, different degrees of gate-overdrive voltage will be formed. The upper curve CVi in FIG. 16 corresponds to a higher gate-overdrive voltage. The current formed on the read bit line RBL is positively correlated with the gate-overdrive voltage. That is, the current formed on the read bit line RBL is positively correlated with the storage potential VSN1i. Therefore, various levels of the storage potential VSN1i can be stored in the storage node SN, so that the weight Wi has different levels of analog values.

That is to say, as shown in FIG. 17, in the read-operation procedure P13 of the training mode M1, the different storage potential VSN1i of the storage node SN is used to change the conductivity of the read transistor 512, so as to form the read current Ii corresponding to the weight Wi.

Figure 18:
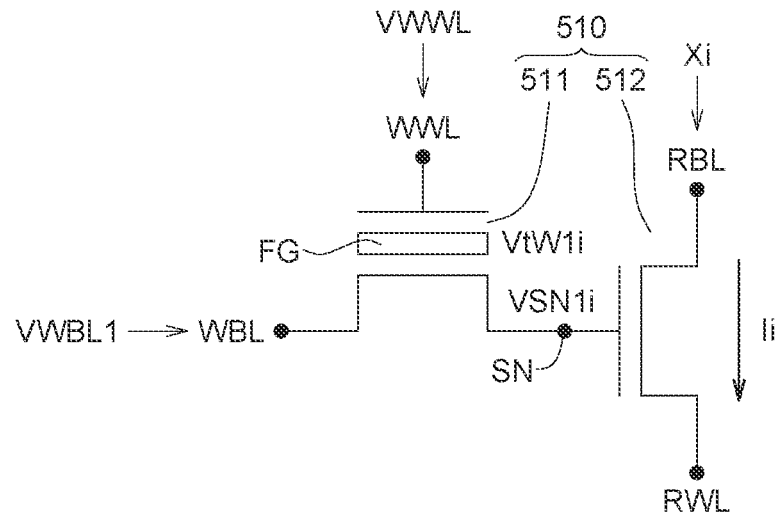
FIG. 18 illustrates the threshold voltage of the write transistor.

In addition, please refer to FIG. 18, which illustrates the threshold voltage VtW1i of the write transistor 511. In the read-operation procedure P23 of the inference mode M2, the threshold voltage VtW1i of the write transistor 511 is used to control the conductivity of the write transistor 511 for changing the storage potential VSN1i of the storage node SN. The different storage potential VSN1i of the storage node SN is used to change the conductivity of the read transistor 512, so as to form the read current Ii corresponding to the weight Wi.

Figure 19:
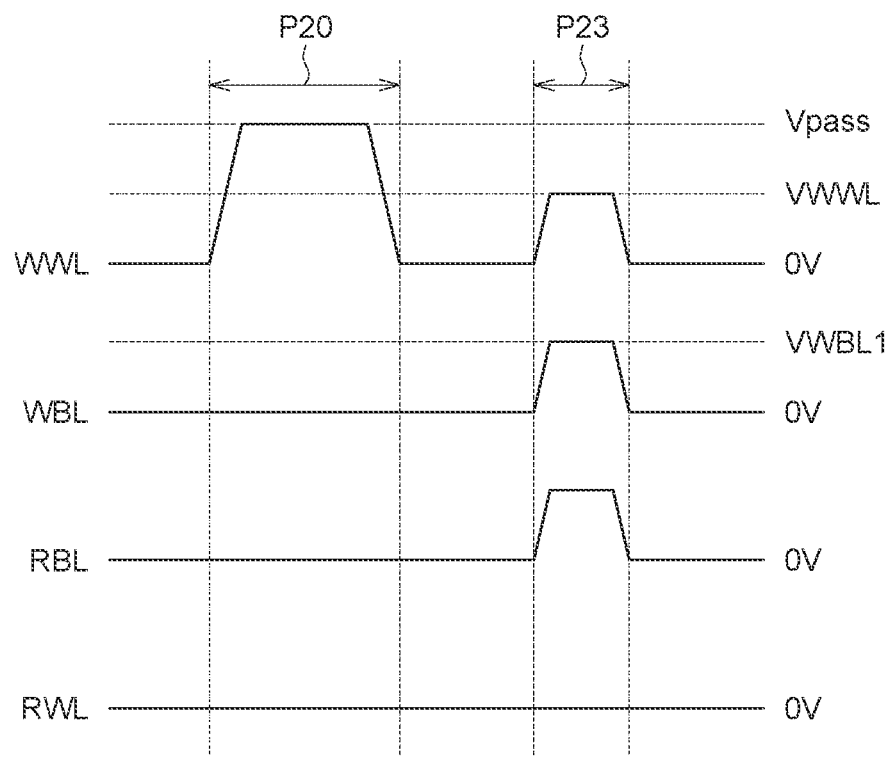
FIG. 19 shows voltage curves of a pre-discharge procedure and the read-operation procedure of the inference mode.
Figure 20:
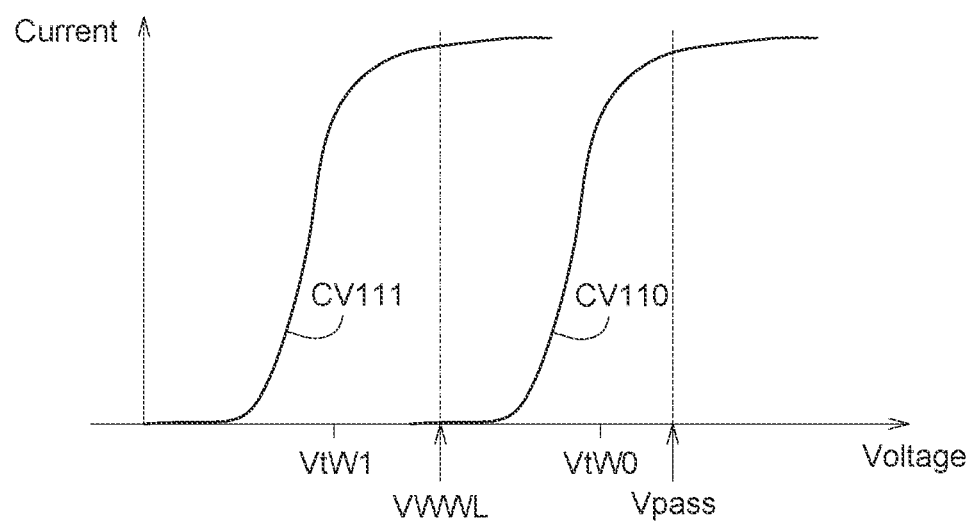
FIG. 20 shows a characteristic curve graph of the write transistor during the inference mode.
Figure 21:
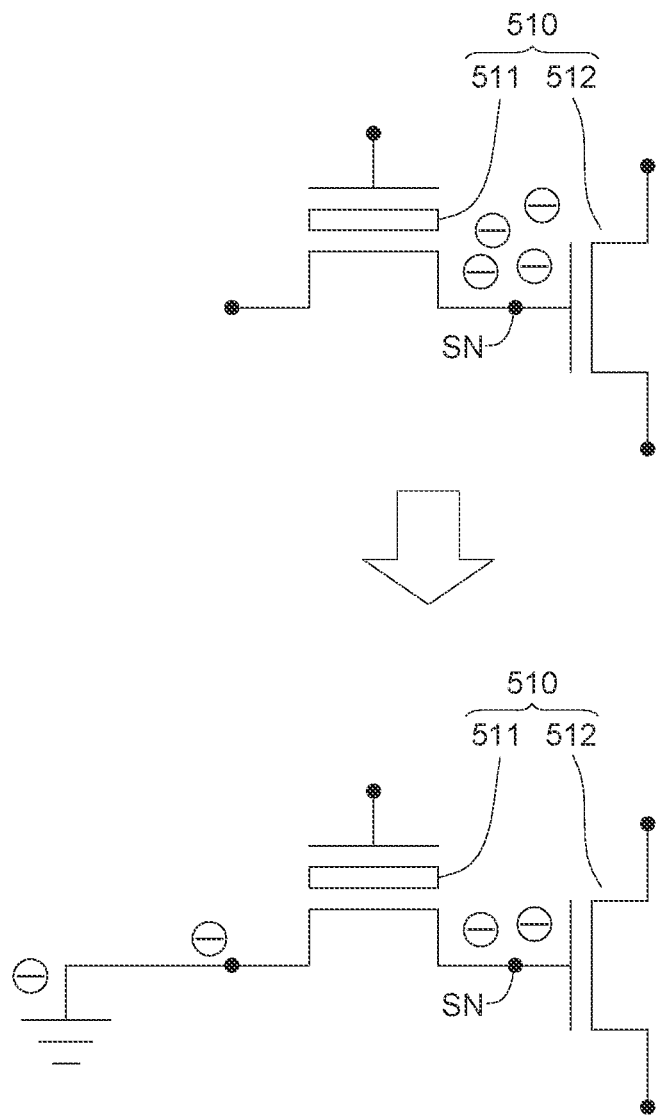
FIG. 21 illustrates the pre-discharge procedure.

In addition, please refer to FIGS. 19 to 21. FIG. 19 shows the voltage curves of a pre-discharge procedure P20 and the read-operation procedure P23 of the inference mode M2. FIG. 20 shows the characteristic curve graph of the write transistor 511 during the inference mode M2. FIG. 21 illustrates the pre-discharge procedure P20. As shown in FIG. 19, before executing the read-operation procedure P23, the pre-discharge procedure P20 will be executed first. In the pre-discharge procedure P20, a pass voltage Vpass is applied to the write word line WWL to turn on the write transistor 511. As shown in FIG. 20, the pass voltage Vpass is higher than the higher threshold voltage VtW0 of the write transistor 511, so that the write transistor 511 is indeed turned on. As shown in FIG. 21, after the write transistor 511 is turned on, the storage node SN is discharged, so that the parasitic charge remaining in the storage node SN can be cleared, so as not to affect the result of the read-operation procedure P23.

According to the above embodiment, the universal memory 500 with 2T structure can be applied to the training mode M1 and the inference mode M2 of artificial intelligence. In the training mode M1 and the inference mode M2, the weight Wi is stored in different locations of the unit cell 510. When the universal memory 500 is executed in the training mode, it can provide high reliability like Dynamic Random Access Memory (DRAM), so as to satisfy a large number of updating actions on the weight Wi; when the universal memory 500 is executed in the inference mode, it can provide the same as the non-volatility and high retention of non-volatile memory enable the weight Wi to be kept well with low power consumption.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A universal memory for In-Memory Computing (IMC), comprising:
   at least one write word line;
   at least one unit cell, including:
      a write transistor, wherein a gate of the write transistor is connected to the write word line, and the write transistor is a transistor with adjustable threshold voltage; and
      a read transistor, wherein a gate of the read transistor is connected to a drain or a source of the write transistor; and
   at least one read word line, connected to a drain or a source of the read transistor;

wherein in a training mode, a storage potential of a storage node between the write transistor and the read transistor represents a weight of the unit cell;

in an inference mode, a threshold voltage of the write transistor represents the weight of the unit cell;

wherein a material of a channel layer of the write transistor is indium gallium zinc oxide (IGZO), indium oxide (In2O3), silicon (Si), germanium (Ge), or trivalent group-pentavalent group material.

2. The universal memory for IMC according to claim 1, wherein the gate of the write transistor includes a charge storage layer.

3. The universal memory for IMC according to claim 1, wherein in a weight changing procedure of the training mode, the threshold voltage of the write transistor is unchanged, when the weight is changed.

4. The universal memory for IMC according to claim 1, wherein in a read-operation procedure of the training mode, the storage potential of the storage node is used to change a conductivity of the read transistor to form a read current corresponding to the weight.

5. The universal memory for IMC according to claim 1, wherein in a read-operation procedure of the inference mode, the weight is unchanged.

6. The universal memory for IMC according to claim 1, wherein a material of a channel layer of the read transistor is indium gallium zinc oxide (IGZO), indium oxide (In2O3), silicon (Si), germanium (Ge), or trivalent group-pentavalent group material.

7. The universal memory for IMC according to claim 1, wherein in a read-operation procedure of the inference mode, a threshold voltage of the write transistor is used to control a conductivity of the write transistor for changing the storage potential of the storage node, so that a read current corresponding to the weight is formed.

8. The universal memory for IMC according to claim 1, wherein the write transistor is connected to a write bit line, and in a read-operation procedure of the inference mode, a voltage of the write bit line is larger than a threshold voltage of the read transistor.

9. The universal memory for IMC according to claim 1, wherein in a pre-discharge procedure of the inference mode, the storage node is discharged.

10. A universal memory for In-Memory Computing (IMC), comprising:
   at least one write word line;
   at least one unit cell, including:
      a write transistor, wherein a gate of the write transistor is connected to the write word line, and the write transistor is a transistor with adjustable threshold voltage; and
      a read transistor, wherein a gate of the read transistor is connected to a drain or a source of the write transistor; and
   at least one read word line, connected to a drain or a source of the read transistor;
   wherein the universal memory is used for a training mode and an inference mode; and in the training mode and the inference mode, a weight is stored at different locations of the unit cell;
   wherein in a weight changing procedure of the training mode, the threshold voltage of the write transistor is unchanged, when the weight is changed.

* * * * *